US006614710B2

(12) United States Patent  
Song et al.

(10) Patent No.: US 6,614,710 B2
(45) Date of Patent: Sep. 2, 2003

(54) SEMICONDUCTOR MEMORY DEVICE AND DATA READ METHOD THEREOF

(75) Inventors: Tae Joong Song, Suwon (KR); In Kyu Park, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/037,908

(22) Filed: Nov. 9, 2001

(65) Prior Publication Data

US 2002/0060938 A1 May 23, 2002

(30) Foreign Application Priority Data

Nov. 21, 2000 (KR) ........................................ 2000-69234

(51) Int. Cl.⁷ ................................................ G11C 8/00
(52) U.S. Cl. ............................ 365/230.03; 365/189.01; 365/230.06
(58) Field of Search ....................... 365/230.03, 230.06, 365/189.01, 235, 230.05

(56) References Cited

U.S. PATENT DOCUMENTS 4,974,153 A  * 11/1990  Pimm et al. ................. 710/306
5,526,318 A  *  6/1996  Slemmer et al. ............. 365/226
6,421,294 B2 *  7/2002  Hidaka ..................... 365/230.03

* cited by examiner

*Primary Examiner*—Hoai Ho
*Assistant Examiner*—Gene N. Auduong
(74) *Attorney, Agent, or Firm*—F. Chau & Associates, LLP

(57) ABSTRACT

Disclosed is a semiconductor memory device and a data read method thereof. The semiconductor memory device comprises a memory cell array comprising a plurality of sub-arrays, said sub-arrays comprising a plurality of memory cells and repeaters, wherein each of said memory cells is connected to a corresponding pair of read word lines, a corresponding pair of read bitlines, a corresponding pair of write word lines, and a corresponding pair of write bitlines, and wherein each of said repeaters is connected to said corresponding pair of read bitlines of each said memory cell and a corresponding pair of common main read bitlines so as to transmit read data from said corresponding pair of read bitlines to said corresponding pair of common main read bitlines in response to an applied enable control signal.

11 Claims, 4 Drawing Sheets

SEMICONDUCTOR MEMORY DEVICE AND DATA READ METHOD THEREOF

CROSS-REFERENCE TO RELATED APPLICATIONS

This application claims the benefit of Korean Patent Application No. 2000-69234, filed on Nov. 21, 2000, the disclosures of which are incorporated by reference herein in their entirety.

BACKGROUND OF THE INVENTION

1. Field of the Invention

The invention refers to a semiconductor memory device and, more particularly, to a read bitline arrangement comprising multi data read/write ports. In addition, a data read method utilizing the device is also described.

2. Description of Related Art

In general, a pair of bitlines connected to a cell of memory cell array in a semiconductor memory device reads data in reading operations and writes data in writing operations. Therefore, because the semiconductor memory device cannot perform both data reading and data writing operations simultaneously, the typical semiconductor memory device comprises unique data read/write ports in transmitting data.

On the other hand, memory devices having multiple data read and write ports provide separate read bitlines and write bitlines to read and write data and thereby permit read and write operations to be performed independently.

FIG. 1 is a block diagram illustrating an example of a conventional semiconductor memory device with multiple read ports and write ports.

The conventional semiconductor memory device of FIG. 1 includes memory cell array 10, first and second row read address decoders 12-1 and 12-2, first and second row write address decoders 14-1 and 14-2, first and second column read multiplexers 16-1 and 16-2, first and second column write multiplexers 18-1 and 18-2, and first and second column read address decoders 20-1 and 20-2. Further, the conventional semiconductor memory device of FIG. 1 also includes first and second column write address decoders 22-1 and 22-2, first and second write drivers 24-1 and 24-2, first and second data input buffers 26-1, and 26-2, and first and second data output buffers 28-1 and 28-2.

In FIG. 1, the memory cell array 10 comprises (1) multiple pairs of read bitlines rb11 and rb12, rb21 and rb22, . . . , rbk1 and rbk2, (2) multiple pairs of read word lines RWL11 and RWL12, RWL21 and RWL22, . . . , RWLm1 and RWLm2, (3) multiple pairs of write bitlines wb11 and wb12, wb21 and wb22, . . . , wbk1 and wbk2, (4) multiple pairs of write word lines WWL11 and WWL12, WWL21 and WWL22, . . . , WWLm1 and WWLm2, and a plurality of memory cells MC connected to those corresponding four types of pairs of lines.

In response to both signals applied from write word lines WWL11, WWL21, . . . , WWWm1, and write control signals wc11, wc21, . . . , wck1, each of a plurality of memory cells MC store data from each of corresponding write bitlines wb11, wb21, . . . , wbk1. In a similar way, in response to both signals applied from write word lines WWL12, WWL22, . . . , WWWm2, and write control signals wc12, wc22, . . . , wck2, each of the memory cells MC store data from each of corresponding write bitlines wb12, wb22, . . . , wbk2. Even though not illustrated in FIG. 1, write control signals wc11, wc21, . . . , wck1 are generated by buffering and delaying first column-selecting control signals WY11, WY12, . . . , WY18. Write control signals wc12, wc22, . . . , wck2 are generated by buffering and delaying second column-selecting control signals WY21, WY22, . . . , WY28.

The device of FIG. 1 includes two data read ports and two data write ports.

The functions of the blocks in the semiconductor memory device of FIG. 1 are as follows:

The first row read address decoder 12-1 decodes a first row read address FRRA, and selects one of first read word lines RWL11, RWL21, . . . , RWLm1. The second row read address decoder 12-2 decodes a second row read address SRRA and selects one of second read word lines RWL21, RWL22, . . . , RWLm2. The first row write address decoder 14-1 decodes a first row write address FRWA and selects one of first write word lines WWL11, WWL21, . . . , WWLm1. The second row write address decoder 14-2 decodes a second row write address SRWA and selects one of second write word lines WWL21, WWL22, . . . , WWLm2. The first column read multiplexer 16-1 selectively outputs data through read bitlines rb11, rb21, . . . , rbm1. In this case, when a multiplexer is a two-input type, the multiplexer selects a read data transmitted from a selected line between two adjacent read bitlines and outputs the selected read data. In a similar way, the multiplexer of a four-input type selects a read data transmitted from a selected line among four adjacent read bitlines and outputs the selected read data. Therefore, the multiplexer of an eight-input type selects a read data transmitted from a selected line among eight adjacent read bitlines and outputs the selected read data. FIG. 1 illustrates a semiconductor memory device with an eight-input multiplexer, meaning that, in response to the column-selecting control signals RY11, RY12, . . . , RY18, the multiplexer of the eight-input type selects a read data transmitted from a selected line among eight adjacent read bitlines and outputs the selected read data. The second column read multiplexer 16-2 outputs a read data selectively according to the input type of the multiplexer in the same way as the first column read multiplexer 16-1 selectively.

The first column write multiplexer 18-1 puts data to write bitlines wb11, wb21, . . . , wbm1 and the second column write multiplexer 18-2 puts data to write bitlines wb12, wb22, . . . , wbm2. In response to column-selecting control signals WY11, WY12, . . . WY18 and WY21, WY22, . . . , WY28, the first and the second column write multiplexers 18-1 and 18-2 apply the data to a selected one line of a bitline pair in a manner analogous to the read operations of the first and the second column read multiplexers 16-1 and 16-2.

The first column read address decoder 20-1 decodes three bits of the first column read address FCRA and generates eight column-selecting control signals RY11, RY12, . . . , RY18. The second column read address decoder 20-2 decodes three bits of the second column read address SCRA and generates eight column-selecting control signals RY21, RY22, . . . , RY28. The first column write address decoder 22-1 decodes three bits of the first column write address FCWA and generates eight column-selecting control signals WY11, WY12, . . . , WY18. The second column write address decoder 22-2 decodes three bits of the second column write address SCWA and generates eight column-selecting control signals WY21, WY22, . . . , WY28.

The first write driver 24-1 drives the first write data and the second write driver 24-2 drives the second write data through the write multiplexers. The first data input buffer 26-1 buffers first input data Din1 from the outside and generates a first write data. The second data input buffer 26-2 buffers second input data Din2 and generates a second write data. The first data output buffer 28-1 buffers first read data from the first column read multiplexer 16-1 and generates a first output data Dout1. The second data output buffer 28-2 buffers second read data from the second column read multiplexer 16-2 and generates a second output data Dout2.

Operations of the semiconductor memory device of FIG. 1 are as follows:

An applied write enable signal (not shown) enables a write operation and then the write operation is executed when a first write address and a first input data are applied on the rising edge of a clock signal.

An example of a write operation may be illustrated with the assumption that the first input data Din1 is "00 . . . 0", the first row write address FRWA is "00 . . . 0", and the first column write address FCWA is "000".

The first data input buffer 26-1 buffers and outputs the first input data Din1 "00 . . . 0". The first write driver 24-1 drives the output data of the first data input buffer 26-1. The first column write address decoder 22-1 decodes the first column write address FCWA as "000" and generates the first column-selecting control signal WY11 at logical "high" while the other first column-selecting control signal WY12, . . . , WY18 are in "low" logic levels. The first row write address decoder 14-1 decodes the first row write address FRWA as "00 . . . 0" and selects the first write word line WWL11 by raising it to logical "high".

In response to the first column-selecting control signal WY11 being at logical "high", the first column write multiplexer 18-1 outputs the data from the first data input buffer 26-1 to the adjacent eight write bitlines wb11, wb91, . . . , wb(k–8)1 among the first write bitlines wb11, wb21, . . . , wbk1. The first column write multiplexer 18-1 also selects write control signals wc11, wc91, . . . , wc(k–8)1 in response to the column-selecting control signal WY11 being at logical "high". Then, the first write data is stored in memory cell MC connected to both the first write word line WWL11 and the adjacent eight write bitlines wb11, wb91, . . . , wb(k–8)1.

Writing operations of the second input data Din2 are performed by the second row write address decoder 14-2, the second data input buffer 26-2, the second write driver 24-2, the second column write address decoder 22-2, and the second column write multiplexer 18-2. Each of writing operations of the first input data Din1, writing operations of the second input data Din2, reading operations of the first output data Dout1, and reading operations of the second output data Dout2 are performed independently and individually.

An applied read enable signal (not shown) initiates a read operation. The following example illustrate read operations on the assumption that the first row read address FRRA is "00 . . . 1" and the first column read address FCRA is "001".

The first row read address decoder 12-1 decodes the first row read address FRRA as "00 . . . 1" and selects the first read word line RWL21, bringing it to logical "high". Then, the first read data from the memory cell MC connected to the first read word line RWL21 is outputted to the first read bitlines rb11, rb21, . . . , rbk1. The first column read address decoder 20-1 decodes the first column read address FCRA as "001" and generates the first column-selecting signal RY12 of "high" logic level while the first column read address decoder 20-1 generates a "low" logic level in the other of the first column-selecting signals RY11, . . . , RY18. In response to the first column-selecting signal RY12 being at a "high" logic level, the first column read multiplexer 16-1 selects and outputs data from the adjacent eight bitlines rb21, rb101, . . . , rb(k–7)1 from the set of first read bitlines rb11, rb21, . . . , rbk1. The first data output buffer 28-1 buffers data from the first column read multiplexer 16-1 and outputs the data through the first output data Dout1. Writing operations of the second output data Dout2 are performed by the second row read address decoder 12-2, the second column read multiplexer 16-2, the second column read address decoder 20-2, and the second data output buffer 28-2. Reading operations in the second output data Dout2, reading operations in the first output data Dout1, writing operations of the first input data Din1, and writing operations in the second input data Din2 are performed independently and individually.

However, the semiconductor memory device of FIG. 1 cannot perform both read operations and write operations in the same address simultaneously without data contention. What is needed is a device and method that can both read and write from the same address substantially simultaneously.

A Referring to FIG. 2 there is shown a circuit diagram of a typical memory cell MC that may also be utilized in the invention. The memory cell MC shown as an example in the drawing is that connected to read word lines RWL11 and RWL12, write word lines WWL11 and WWL12, read bitlines rb11 and rb12, and write bitlines wb11 and wb12.

The memory cell MC of FIG. 2 comprises NMOS transistors N1, N2, N5, N6, N7, and N8, inverter INV2, which itself comprises NMOS transistor N3 and PMOS transistor P1, and inverter INV3, which itself comprises NMOS transistor N4 and PMOS transistor P2.

Inverters INV2 and INV3 latch data between nodes Nd1 and Nd2. NMOS transistors N1 and N2 transmit read data to corresponding read bitlines rb11 and rb12 in response to selecting signals in corresponding read word lines RWL11 and RWL12, respectively. The inverter INV1 inverts the read data and transmits it to node Nd3. NMOS transistors N5 and N6 transmit write data to node Nd2 in response to selecting signals in corresponding write word lines WWL11 and WWL12, respectively. NMOS transistors N7 and N8 transmit write data of the corresponding write bitlines wb11 and wb12 to NMOS transistors N5 and N6 in response to corresponding write control signals wc11 and wc21.

As the capacity of memory cell array 10 increases, the greater are the number of memory cells are arranged in the column direction. In such case, the length of the first read bitlines rb11, rb12, . . . , rbk1, the second read bitlines rb12, rb22, . . . , rbk2, the first write bitlines wb11, wb12, . . . , wbk1, and the second write bitlines wb12, wb22, . . . , wbk2 is increased so that the number of NMOS transistors N1 and N2, N7 and N8 connected to those corresponding lines can be increased, which finally results in an increase in line load capacitances, which slows down speeds in both read and write operations, and raises the consumption voltages in the memory cells.

In addition, transmission gates transmitting read data, such as transistors N1 and N2, show good transmission performance for logical "low", but poor transmission performance for logical "high". A way to improve transmission performance in "high" logic level data is to increase both the size of NMOS transistors N1 and N2, and the size of inverter INV1. However, increasing the size of NMOS transistors N1 and N2, and the size of inverter INV1 results in increased line load capacitances.

Enlarging the sizes of the first and the second write drivers 24-1 and 24-2 can improve write speed, but at the cost of increasing line load capacitances in the first bitlines wb11, wb21, ..., wbk1 and in the second write bitlines wb12, wb22, ..., wbk2.

What is needed is a semiconductor memory device with improved speeds in data read/write operations regardless of increases in bitline load capacitances.

SUMMARY OF THE INVENTION

Disclosed is a semiconductor memory device comprising a memory cell array comprising a plurality of sub-arrays, said sub-arrays comprising a plurality of memory cells and repeaters, wherein each of said memory cells is connected to a corresponding pair of read word lines, a corresponding pair of read bitlines, a corresponding pair of write word lines, and a corresponding pair of write bitlines, and wherein each of said repeaters is connected to said corresponding pair of read bitlines of each said memory cell and a corresponding pair of common main read bitlines so as to transmit read data from said corresponding pair of read bitlines to said corresponding pair of common main read bitlines in response to an applied enable control signal.

In another aspect of the invention, each said memory cell comprises a pre-determined number of read data transmission gates transmitting read data to the corresponding read bitline in response to a corresponding read word line control signal applied through the corresponding read word line, a pre-determined number of write data transmission gates transmitting write data of the corresponding write bitline in response to a corresponding write word line control signal applied through the corresponding write word line, a latch latching the write data transmitted from a pre-determined number of the write data transmission gates, and a pre-determined number of read data driving gates driving the stored data in the latch and outputting the stored data to the corresponding read data transmission gate.

In another aspect of the invention, the applied enable control signal is generated by decoding pre-determined bits in a row address.

In another aspect of the invention, each of the multiple repeaters in each sub-array according to claim 1 comprises a first inverter inverting a signal of the read bitline, a second inverter inverting the output signal of the first inverter in response to the applied enable control signal, a first PMOS transistor with a source applying a power voltage, a drain applying a signal of the read bitline, and a gate applying the output signal of the first inverter, a first NMOS transistor with a drain connected to the drain of the first PMOS transistor, and a gate applying the applied enable control signal, and a second NMOS transistor with a source applying a ground voltage, and a gate applying the output signal of the first inverter, wherein a source of the first NMOS transistor is connected to a drain of the second NMOS transistor.

Also disclosed is a semiconductor memory device comprising a memory array comprising a plurality of sub-arrays, each said sub-array comprising a plurality of memory cells, said memory cells connected to a corresponding pair of read word lines, a corresponding pair of read bitlines, a corresponding pair of write word lines, and a corresponding pair of write bitlines, multiple repeaters in each sub-array, each of the multiple repeaters connected to both the corresponding pair of read bitlines and the corresponding pair of common main read bitlines for connecting commonly the corresponding pair of read bitlines in each sub-array, transmitting read data in the corresponding pair of read bitlines to the corresponding pair of common main read bitlines, in response to an applied enable control signal, and multiple write repeaters in each sub-array, each of the multiple write repeaters connected to both the corresponding pair of write bitlines and the corresponding pair of common main write bitlines for connecting commonly the corresponding pair of write bitlines in each sub-array, transmitting write data in the corresponding pair of write bitlines to the corresponding pair of common main write bitlines, in response to an applied enable control signal.

In another aspect of the invention, each memory cell comprises a pre-determined number of read data transmission gates transmitting read data to the corresponding read bitline in response to a corresponding read word line control signal applied through the corresponding read word line, a pre-determined number of write data transmission gates transmitting write data of the corresponding write bitline in response to a corresponding write word line control signal applied through the corresponding write word line, a latch latching the write data transmitted from a pre-determined number of the write data transmission gates, and a pre-determined number of read data operation gates operating the stored data in the latch and outputting the stored data to the corresponding read data transmission gate.

In another aspect of the invention, the applied enable control signal is generated by decoding pre-determined bits in a row address.

In another aspect of the invention, each said repeater comprises a first inverter inverting a signal of the read bitline, a second inverter inverting the output signal of the first inverter in response to the applied enable control signal and transmitting the inverted output signal to the corresponding common main read bitline, a first PMOS transistor with a source applying a power voltage, a drain applying a signal of the read bitline, and a gate applying the output signal of the first inverter, a first NMOS transistor with a drain connected to the drain of the first PMOS transistor, and a gate applying the applied enable control signal, and a second NMOS transistor with a source applying a ground voltage, a drain connected to the source of the first NMOS transistor, and a gate applying the output signal of the first inverter.

In another aspect of the invention, each said write repeater in each said sub-array comprises a third inverter inverting a signal of the common main write bitline, a fourth inverter inverting the output of the third inverter in response to the applied enable control signal, and transmitting the inverted output signal to the write bitline, a second PMOS transistor with a source applying a power voltage, a drain applying a signal of the common main write bitline, and a gate applying the output signal of the third inverter, a third NMOS transistor with a drain connected to the drain of the second PMOS transistor, and a gate applying the applied enable control signal, a fourth NMOS transistor with a source applying a ground voltage, and a gate applying the output signal of the third inverter, and wherein a source of the third NMOS transistor is connected to a drain of the fourth NMOS transistor.

Disclosed is a data read method in a semiconductor memory device comprising a memory array comprising a plurality of sub-arrays, each said sub-array comprising a plurality of memory cells, said memory cells connected to all of a corresponding pair of read word lines, a corresponding pair of read bitlines, a corresponding pair of write word lines and a corresponding pair of write bitlines, the data read method, transmitting read data of the corresponding pair of read bitlines to a corresponding pair of common main read bitlines so as to commonly connect the corresponding pair of common main read bitlines to the corresponding pair of read bitlines in each sub-array, in response to an applied enable control signal selecting each sub-array.

In another aspect of the invention, the data read method further comprises transmitting write data in the common main write bitlines so as to commonly connect the corresponding pair of common main write bitlines in each sub-array to the corresponding pair of write bitlines, in response to an applied enable control signal in a write operation.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, example of which is illustrated in the accompanying drawings.

Figure 1:
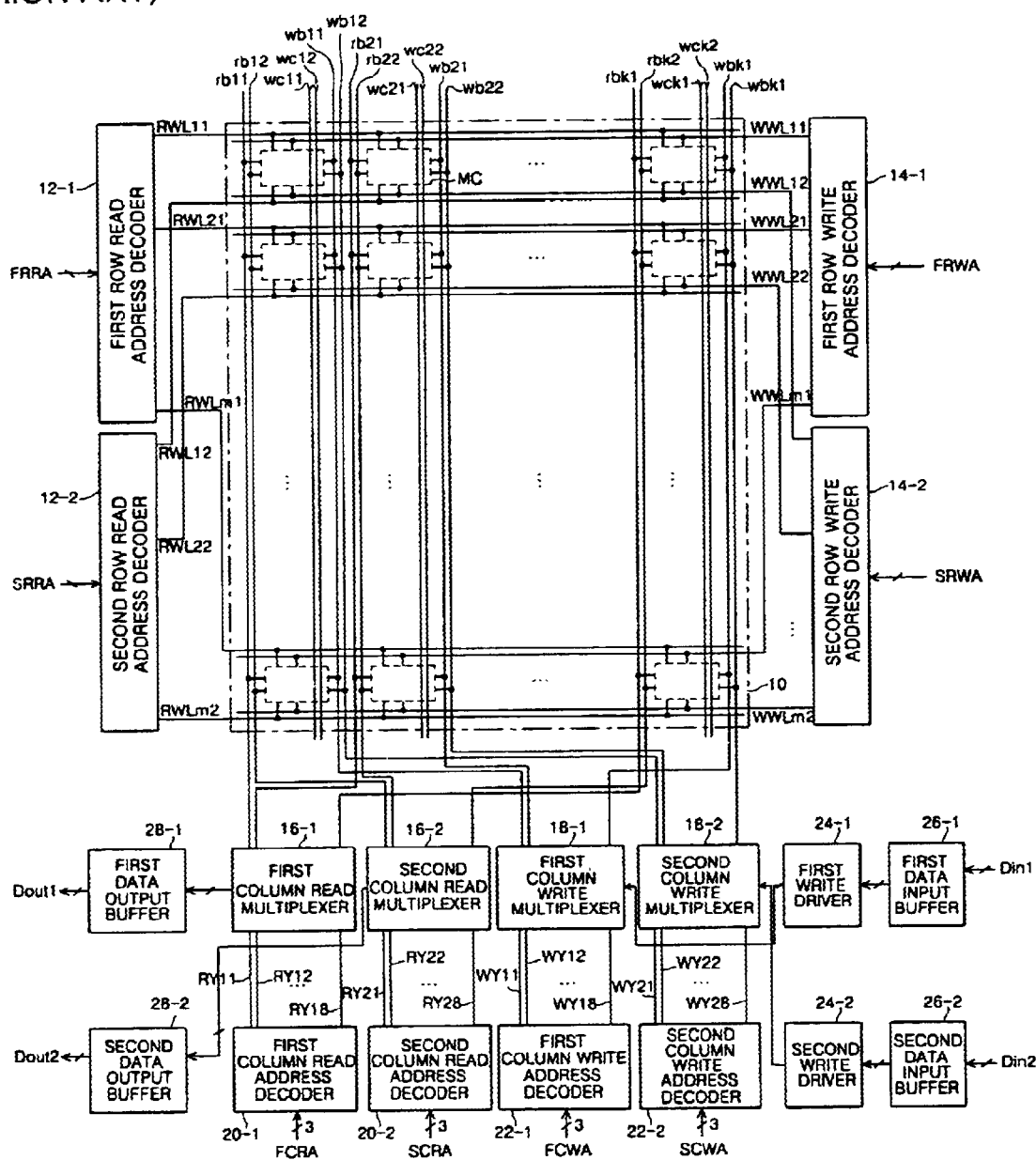
FIG. 1 is a block diagram illustrating an example of a conventional semiconductor memory device with both multiple data read ports and multiple data write ports.
Figure 2:
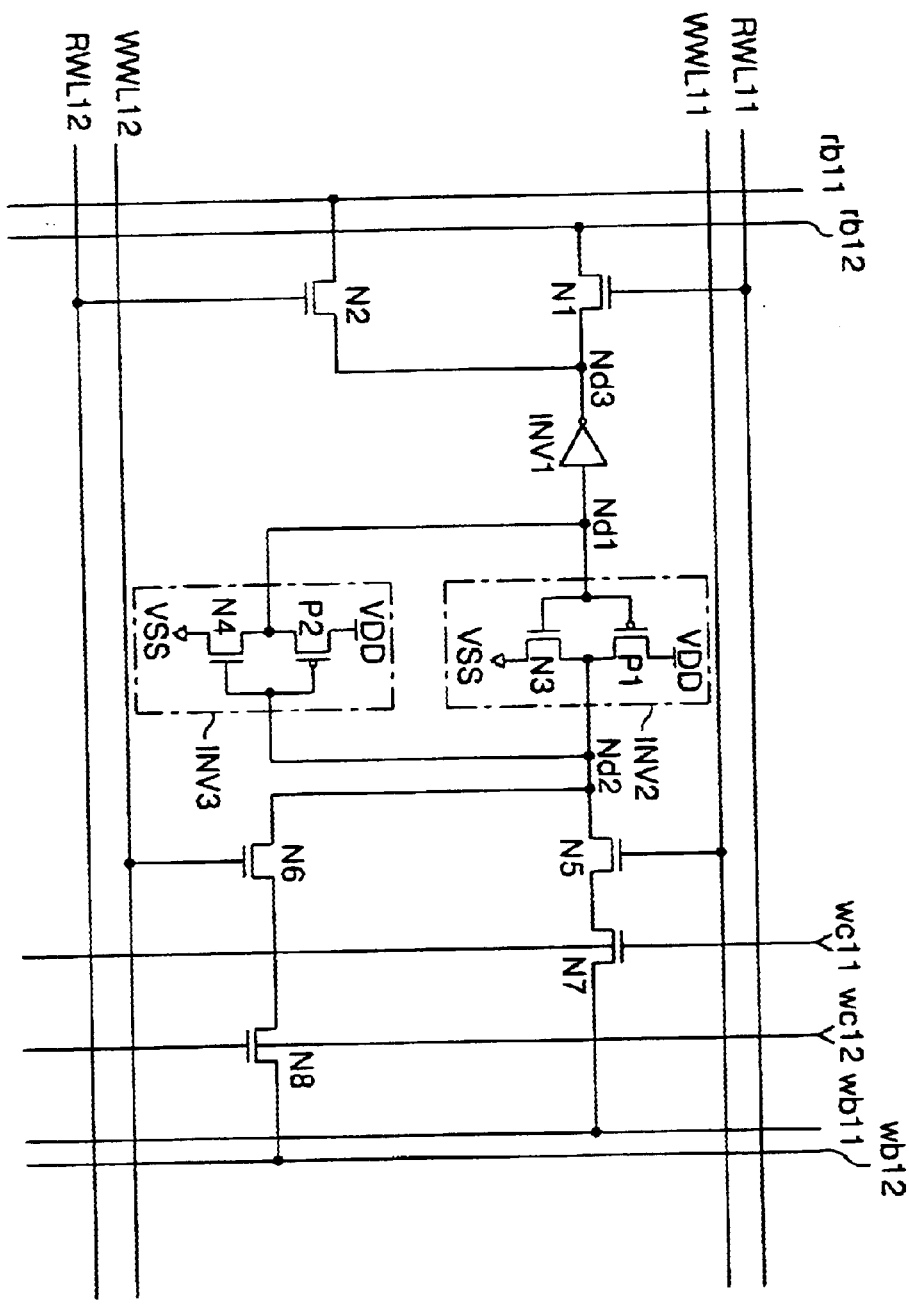
FIG. 2 is a circuit diagram illustrating a memory cell of a preferred embodiment of the invention.
Figure 3:
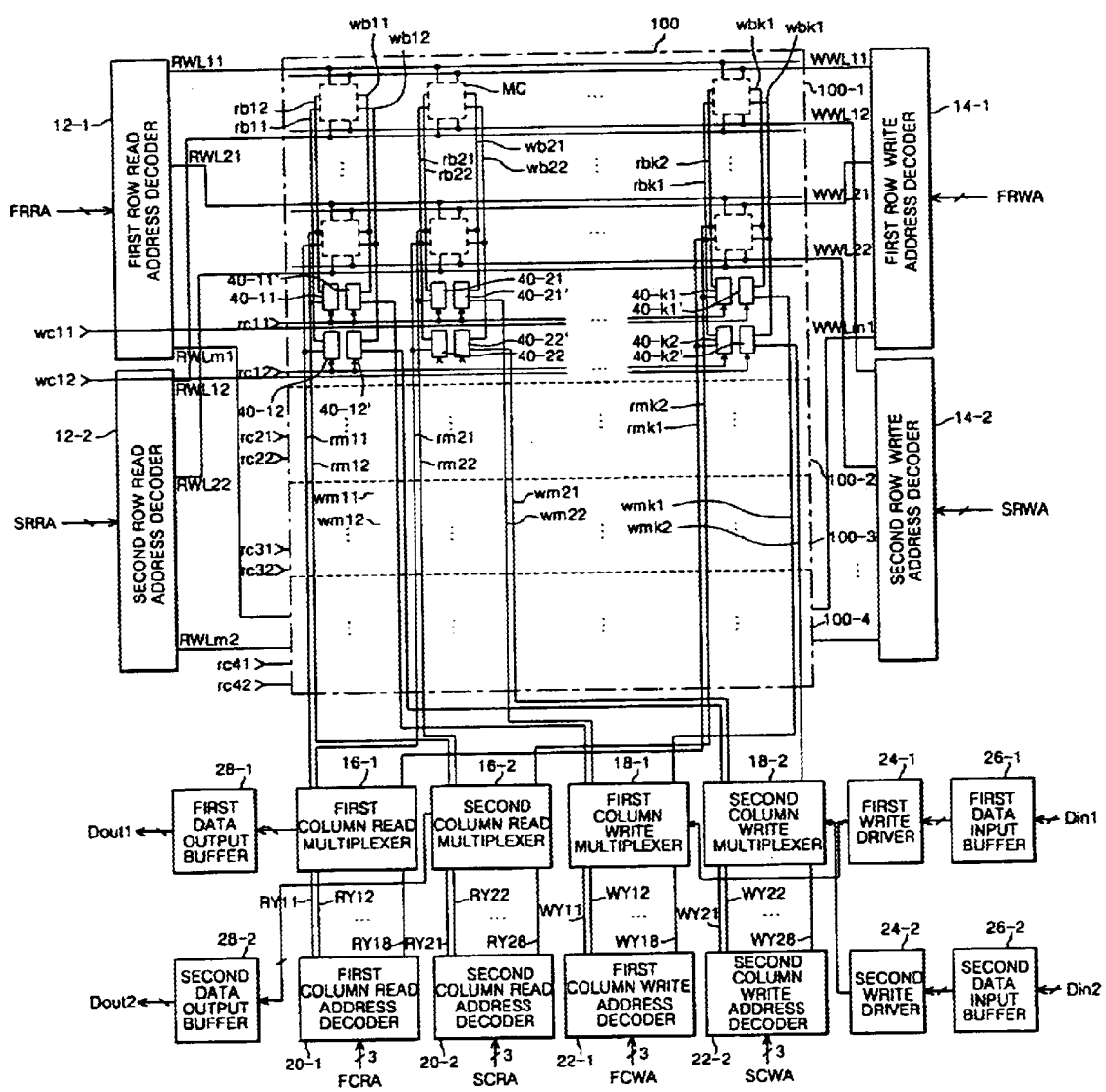
FIG. 3 is a block diagram illustrating a semiconductor memory device comprising multi data read ports and multi data write ports, according to a preferred embodiment of the invention.

Referring to FIG. 3, there is shown a block diagram illustrating a semiconductor memory device comprising multiple data read ports and multiple data write ports, according to a preferred embodiment of the invention. As illustrated in FIG. 3, memory cell array 100 is substituted for memory cell array 10 in FIG. 1 and it is to be understood that peripheral devices shown in the drawing identified by numerals identical to those in FIG. 1 operate in the same manner as those described with respect to FIG. 1. The memory array 100 of FIG. 3 may utilize the prior art memory cells described in FIG. 2.

Memory cell array 100 of a preferred embodiment of the invention is divided into four memory cell sub-arrays 100-1, 100-2, 100-3, and 100-4, and read bitlines rb11, rb12, rb21, rb22, . . . , rbk1, rbk2 are divided into four parts, each in one of the four sub-arrays.

Each of read bitlines rb11, rb12, rb21, rb22, . . . , rbk1, rbk2, divided into four parts, is connected to common main read bitlines rm11, rm12, rm21, rm22, . . . , rmk1, rmk2 through repeaters 40-11, 40-12, 40-21, 40-22, . . . , 40-k1, 40-k2. The common main read bitlines rm11, rm12, rm21, rm22, . . . , rmk1, rmk2 are connected to the first and the second column read multiplexers 16-1 and 16-2.

Each of the corresponding repeaters 40-11, 40-21, . . . , 40-k1 in the four divided memory cell sub-arrays 100-1, 100-2, 100-3, 100-4 outputs read data in response to each of four corresponding repeater control signals rc11, rc21, rc31, rc41 generated by decoding an upper two bits in the first row address. Each of the corresponding repeaters 40-12, 40-22, . . . , 40-k2 in the four divided memory cell sub-arrays 100-1, 100-2, 100-3, 100-4 outputs read data in response to each of four corresponding repeater control signals rc12, rc22, rc32, rc42 generated by decoding an upper two bits in the second row address. Repeaters 40-11, 40-21, . . . , 40-k1 in the memory cell sub-array 100-1 output read data in response to the repeater control signal rc11 when the upper two bits of the first row address are "00". Repeaters 40-11, 40-21, . . . , 40-k1 in the memory cell sub-array 100-2 output read data in response to the repeater control signal rc21 when the upper two bits of the first row address are "01". Similarly, Repeaters 40-12, 40-22, . . . , 40-k2 in the memory cell sub-array 100-3 output read data in response to the repeater control signal rc32 when the upper two bits of the second row address are "10". Repeaters 40-12, 40-22, . . . , 40-k2 in the memory cell sub-array 100-4 output read data in response to the repeater control signal rc42 when the upper two bits of the second row address are "11 ".

By dividing bitlines rb11, rb12, rb21, rb22, . . . , rbk1, rbk2 into four parts, bitline load capacitances are reduced. Of course, the invention is not limited to a four-part division. The teachings of the invention may be generalized to any n-part divisions as desired.

Each of divided read bitlines rb11, rb12, rb21, rb22, . . . , rbk1, rbk2 is connected to each of corresponding common main read bitlines rm11, rm12, rm21, rm22, . . . , rmk1, rmk2. Line load capacitances in each of common main read bitlines rm11, rm12, rm21, rm22, . . . , rmk1, rmk2 is less than those of read bitlines rb11, rb12, rb21, rb22, . . . , rbk1, rbk2 in the conventional semiconductor memory device of FIG. 1, because each of common main read bitlines rm11, rm12, rm21, rm22, . . . , rmk1, rmk2 connect to only four repeaters.

For write operation, a plurality pairs of write repeaters 40-11', 40-12', 40-21', 40-22', . . . , 40-k1', and 40-k2' in each sub-array are provided to transmit write data between write bitlines and common main write bitlines wm11, wm12, wm21, wm22, . . . , wmk1, and wmk2. Each pair of the write repeaters is connected to both the corresponding pair of write bitlines and the corresponding pair of common main write bitlines for connecting commonly the corresponding pair of write bitlines in each sub-array, transmitting write data in the corresponding pair of write bitlines to the corresponding pair of common main write bitlines, in response to applied enable control signals wc11, wc12, . . . , wck1, and wck2 (only wc11 and wc12 shown in FIG. 3).

Figure 4:
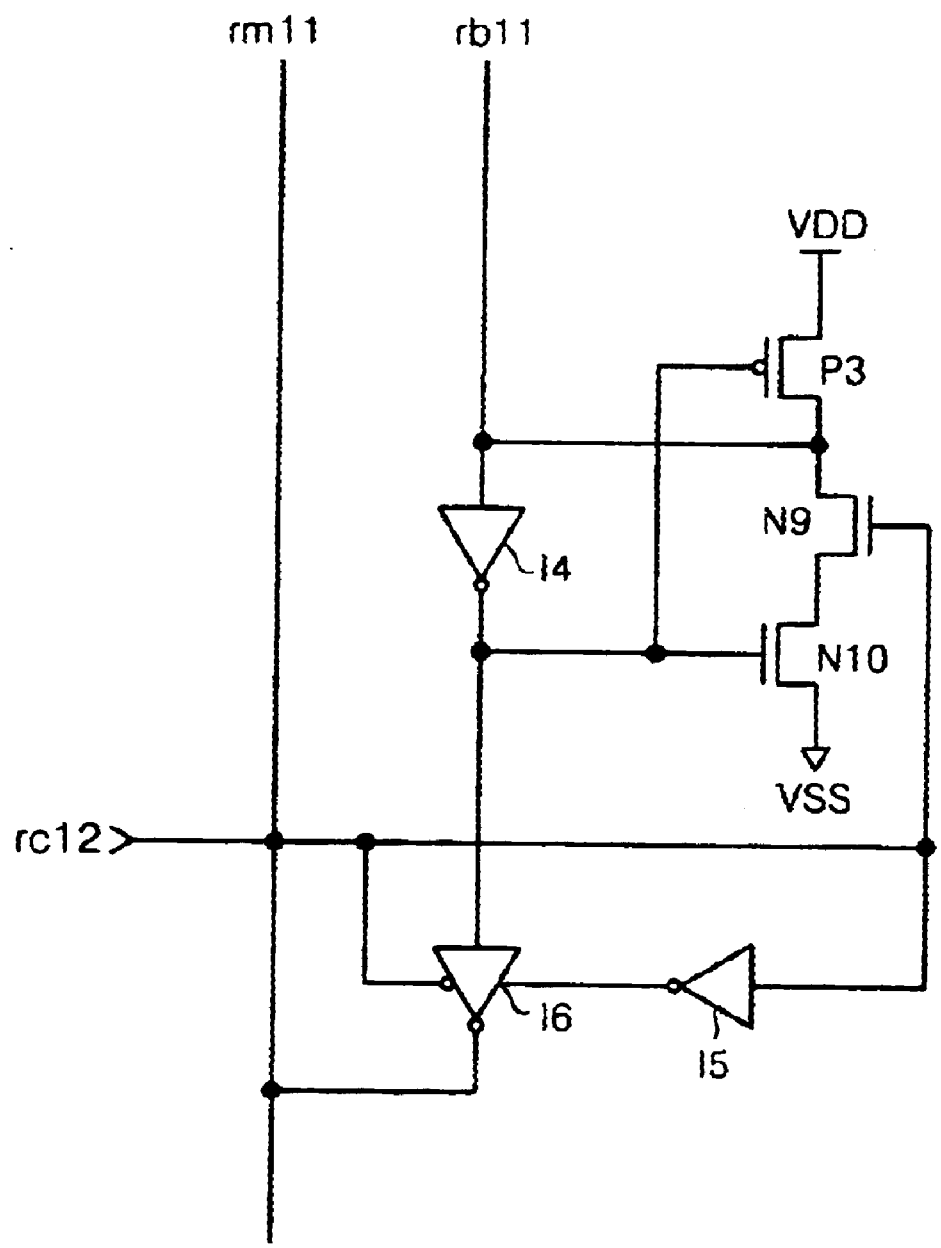
FIG. 4 is a circuit diagram illustrating a repeater in a preferred embodiment of the invention.

Referring to FIG. 4 there is depicted a circuit diagram illustrating a repeater in a preferred embodiment of the invention. The repeater comprises PMOS transistor P3, NMOS transistors N9 and N10, inverters 14 and 15, and tri-state inverter 16.

The specific repeater here illustrated as an example is that labeled 40-21 in FIG. 3. The repeater is connected to both the read bitline rb11 and the common main read bitline rm11. The inverter 14 inverts read data in the read bitline rb11. The source of PMOS transistor P3 is connected to a power voltage VDD, the drain to the read bitline rb11, and the gate to the output signal of the inverter 14. The source of NMOS transistor N9 is connected to the drain of NMOS transistor N10, the drain of N9 connects to the drain of PMOS transistor P3, the gate of N9 to the repeater control signal rc12. The source of NMOS transistor N10 is connected to a ground voltage VSS, the drain to the source of NMOS transistor N9, and the gate to the output signal of the inverter 14. The inverter 15 inverts the repeater control signal rc12. The tri-state inverter 16 outputs the signal of the inverter 14 to the common main read bitline rm11 in response to both the output signal of the inverter 15 and the repeater control signal rc12.

The operation of the repeater of FIG. 4 is as follows:

As an example, assume a transmitted signal to the read bitline rb11 is a "low" logic level so that inverter 14 is now inverting a logical "low" so as to generate a logical "high". Further assume that the repeater control signal rc12 is "low". The tri-state inverter 16 turns on in response to the "low" repeater control signal rc12 and inverts the "high" output signal of the inverter 14 to a logical "low" that is then asserted on the common main read bitline rm11. Hence, the "low" signal on line rb11 has been repeated to line rm11.

Likewise, so long as the repeater control rc12 is "low", a "high" signal on read bitline rb11 will be repeated to the common main read bitline rm11. In addition, PMOS transistor P3 turns on in response to the "low" output signal of the inverter 14, and thereby amplifies the "high" input applied to the inverter 14. In other words, PMOS transistor P3 is turned on to enlarge the signal of "high" logic levels in the read bitline rb11 because data transmission performance of "high" logic levels in NMOS transistors is poor.

The repeater in the semiconductor memory device of the invention in FIG. 4 buffers and transmits read data between the read bitline and the common main read bitline. In addition, the repeater of FIG. 4 assists "high" logic level signals inputted from the bitline thereby improving operation speeds in transmitting "high" signals.

A preferred embodiment of the invention in FIG. 3 divides the read bitline in the memory cell array into four parts. However, at least more than two divided read bitlines in the memory cell array is enough to get the same effects in the above statements. In other words, the read bitline can be divided appropriately according to the increase in the number of memory cells connected to the read bitline. Too many numbers of repeaters in memory cell array may occupy too large a layout area. Therefore, it is preferable that the read bitline is divided appropriately by speed versus space.

The above description of the invention divides the read bitline to improve the read operation speed. In another embodiment the write bitlines may also be divided to improve both read and write operation speeds.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A semiconductor memory device comprising:
   a memory cell array comprising a plurality of sub-arrays;
   said sub-arrays comprising a plurality of memory cells and a plurality of pairs of repeaters;
   wherein each of said memory cells is connected to a corresponding pair of read word lines, a corresponding pair of read bitlines, a corresponding pair of write word lines, and a corresponding pair of write bitlines; and
   wherein each pair of said repeaters is connected to said corresponding pair of read bitlines of each said memory cell and a corresponding pair of common main read bitlines to transmit read data from said corresponding pair of read bitlines to said corresponding pair of common main read bitlines in response to an applied enable control signal.

2. The semiconductor memory device according to claim 1, wherein said memory cell comprises:
   a pre-determined number of read data transmission gates transmitting read data to the corresponding read bitline in response to a corresponding read word line control signal applied through the corresponding read word line;
   a pre-determined number of write data transmission gates transmitting write data of the corresponding write bitline in response to a corresponding write word line control signal applied through the corresponding write word line;
   a latch latching the write data transmitted from a pre-determined number of the write data transmission gates; and
   a pre-determined number of read data driving gates driving the stored data in the latch and outputting the stored data to the corresponding read data transmission gate.

3. The semiconductor memory device according to claim 1, wherein the applied enable control signal is generated by decoding pre-determined bits in a row address.

4. The semiconductor memory device according to claim 1, wherein each of the repeaters in each sub-array according to claim 1 comprises:
   a first inverter inverting a signal of the read bitline;
   a second inverter inverting the output signal of the first inverter in response to the applied enable control signal;
   a first PMOS transistor with a source applying a power voltage, a drain applying a signal of the read bitline, and a gate applying the output signal of the first inverter;
   a first NMOS transistor with a drain connected to the drain of the first PMOS transistor, and a gate applying the applied enable control signal; and
   a second NMOS transistor with a source applying a ground voltage, and a gate applying the output signal of the first inverter,
   wherein a source of the first NMOS transistor is connected to a drain of the second NMOS transistor.

5. A semiconductor memory device comprising:
   a memory array comprising a plurality of sub-arrays;
   each said sub-array comprising a plurality of memory cells;
   said memory cells connected to a corresponding pair of read word lines, a corresponding pair of read bitlines, a corresponding pair of write word lines, and a corresponding pair of write bitlines;
   a plurality of pairs of read repeaters in each sub-array, each pair of the read repeaters connected to both the corresponding pair of read bitlines and the corresponding pair of common main read bitlines for connecting commonly the corresponding pair of read bitlines in each sub-array, transmitting read data in the corresponding pair of read bitlines to the corresponding pair of common main read bitlines, in response to an applied enable control signal; and
   a plurality of pairs of write repeaters in each sub-array, each pair of the write repeaters connected to both the corresponding pair of write bitlines and the corresponding pair of common main write bitlines for connecting commonly the corresponding pair of write bitlines in each sub-array, transmitting write data in the corresponding pair of write bitlines to the corresponding pair of common main write bitlines, in response to an applied enable control signal.

6. The semiconductor memory device according to claim 5, wherein each memory cell comprises:

a pre-determined number of read data transmission gates transmitting read data to the corresponding read bitline in response to a corresponding read word line control signal applied through the corresponding read word line;

a pre-determined number of write data transmission gates transmitting write data of the corresponding write bitline in response to a corresponding write word line control signal applied through the corresponding write word line;

a latch latching the write data transmitted from a pre-determined number of the write data transmission gates; and a pre-determined number of read data operation gates operating the stored data in the latch and outputting the stored data to the corresponding read data transmission gate.

7. The semiconductor memory device according to claim 5, wherein the applied enable control signal is generated by decoding pre-determined bits in a row address.

8. The semiconductor memory device according to claim 5, wherein each said repeater comprises:

a first inverter inverting a signal of the read bitline;

a second inverter inverting the output signal of the first inverter in response to the applied enable control signal and transmitting the inverted output signal to the corresponding common main read bitline;

a first PMOS transistor with a source applying a power voltage, a drain applying a signal of the read bitline, and a gate applying the output signal of the first inverter;

a first NMOS transistor with a drain connected to the drain of the first PMOS transistor, and a gate applying the applied enable control signal; and a second NMOS transistor with a source applying a ground voltage, a drain connected to the source of the first NMOS transistor, and a gate applying the output signal of the first inverter.

9. The semiconductor memory device according to claim 5, wherein each said write repeater in each said sub-array comprises:

a third inverter inverting a signal of the common main write bitline;

a fourth inverter inverting the output of the third inverter in response to the applied enable control signal, and transmitting the inverted output signal to the write bitline;

a second PMOS transistor with a source applying a power voltage, a drain applying a signal of the common main write bitline, and a gate applying the output signal of the third inverter;

a third NMOS transistor with a drain connected to the drain of the second PMOS transistor, and a gate applying the applied enable control signal;

a fourth NMOS transistor with a source applying a ground voltage, and a gate applying the output signal of the third inverter; and wherein a source of the third NMOS transistor is connected to a drain of the fourth NMOS transistor.

10. A data read method in a semiconductor memory device comprising a memory array comprising a plurality of sub-arrays, each said sub-array comprising a plurality of memory cells, said memory cells connected to all of a corresponding pair of read word lines, a corresponding pair of read bitlines, a corresponding pair of write word lines and a corresponding pair of write bitlines, the data read method comprising:

connecting commonly said corresponding pair of read bitlines of each said memory cell to a corresponding pair of common main read bitlines using a pair of read repeaters; and transmitting read data of the corresponding pair of read bitlines to a corresponding pair of common main read bitlines, in response to an applied enable control signal selecting each sub-array.

11. A data read method in a semiconductor memory device according to claim 10, further comprising:

connecting commonly said corresponding pair of write bitlines of each said memory cell to a corresponding pair of common main write bitlines using a pair of write repeaters; and transmitting write data in the common main write bitlines, in response to an applied enable control signal in a write operation.

* * * * *